US006600398B2

(12) United States Patent
Roth et al.

(10) Patent No.: US 6,600,398 B2
(45) Date of Patent: Jul. 29, 2003

(54) SUPERCONDUCTING MAGNET COIL FOR VERY HIGH FIELD HAVING AN HTS COIL SECTION AND METHOD FOR PRODUCTION THEREOF

(75) Inventors: Gerhard Roth, Rheinstetten (DE); Arne Kasten, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 10/147,474

(22) Filed: May 17, 2002

(65) Prior Publication Data

US 2002/0175790 A1 Nov. 28, 2002

(30) Foreign Application Priority Data

May 25, 2001 (DE) .......................................... 101 25 429

(51) Int. Cl.[7] ................................................ H01F 6/00
(52) U.S. Cl. ...................... 335/216; 505/211; 505/705; 505/924; 505/879; 29/599
(58) Field of Search ..................... 335/216; 336/DIG. 1; 324/318, 319, 320; 505/211, 705, 740, 821, 879, 924; 29/599

(56) References Cited

U.S. PATENT DOCUMENTS

| 5,187,859 A | 2/1993 | Heim |
| 5,319,333 A | 6/1994 | Roth |
| 5,531,015 A | 7/1996 | Manlief |
| 5,708,405 A | * 1/1998 | Moriyama et al. ........... 335/216 |
| 5,798,678 A | 8/1998 | Manlief |

FOREIGN PATENT DOCUMENTS

| FR | 2 399 131 | 2/1979 |
| JP | 22 63 17 | 2/1994 |

* cited by examiner

Primary Examiner—Ramon M. Barrera
(74) Attorney, Agent, or Firm—Paul Vincent

(57) ABSTRACT

A superconducting very high field magnet coil with several solenoidal multi-layer coil sections which are wound in layers onto a hollow cylindrical support body (3) about a common central axis a, and which are electrically connected in series to carry a current in excess of 100 A is characterized in that the radially innermost coil section (1) comprises superconducting wire (2) which contains oxidic, high temperature superconductor (HTS) material, wherein the layers of the radially innermost coil section (1) are helically wound such that there is a free axial space between the walls, which is then sealed. The corresponding production method comprises the steps of helically winding a layer of superconducting HTS wire together with a filler wire onto the support body; removing the filler wire from the support body; repeating steps (a) and (b) until a desired number of layers of the coil section is obtained; thermally treating the winding packet for reacting the HTS material under a gaseous atmosphere containing $O_2$ with optimized annealing parameters; and sealing the hollow spaces of the coil section. This permits production of an NMR-capable solenoid coil having only a few superconducting joints, of topologically simple construction that can carry a current of a few hundred amperes and which contains HTS material to produce magnetic fields in excess of 21 Tesla.

34 Claims, 3 Drawing Sheets

SUPERCONDUCTING MAGNET COIL FOR VERY HIGH FIELD HAVING AN HTS COIL SECTION AND METHOD FOR PRODUCTION THEREOF

This application claims Paris Convention priority of DE 101 25 429.6 filed May 25, 2001 the complete disclosure of which is hereby incorporated by reference.

BACKGROUND OF THE INVENTION

The invention concerns a superconducting magnet coil for very high field with several, substantially solenoidal, multi-layer coil sections which are wound in layers onto a hollow cylindrical support body about a common central axis a, which are electrically connected in series and which can carry a current of more than 100 A during operation. The invention also concerns a method for producing such a magnet arrangement.

An arrangement of this type and the corresponding production method are known e.g. from U.S. Pat. No. 5,319,333.

High temperature superconductors (HTS) of oxidic ceramic material have been known since 1986. They are particularly characterized by very high transition temperatures of up to 120K as well as very high critical magnetic field upper limits (BC2).

Such materials have the substantial disadvantage of being very difficult to handle and require highly complicated processing steps and precise maintenance of very narrow boundary conditions in order to produce good superconducting properties.

In a processing step, thermal treatment is carried out in an oxidizing atmosphere at temperatures in the range of 800° C. To maintain the optimum superconducting properties, the oxygen content of the atmosphere must be controlled with high precision and must be continuously provided to the superconductor in the required concentrations in accordance with a desired processing procedure. To achieve optimum isotropy of the material properties, the oxygen concentration and temperature must be kept constant at all locations throughout the production process (with maximum tolerances of a few K).

These requirements can be achieved for relatively freely accessible conducting pieces and, for the generation of magnetic fields, with loosely wound "pancake" coils and, in certain cases, also for tightly wound pancake coils. The upper and lower side of the spiraled pancake coil winding are always freely accessible and permit oxygen to flow through same.

Coils appropriate for the construction of nuclear magnetic resonance (NMR) magnets having a magnetic field of high temporal stability and high homogeneity, cannot be constructed by stacking pancake coils since this would require a very large number of spacious superconducting joints which could not be disposed on a compact coil due to lack of space.

Moreover, the large number of superconducting joints increases the risk of failure of a joint which would produce drifting of the entire magnet.

A pancake arrangement can, at best, produce the required magnetic field homogeneity only with the greatest possible effort.

The preferred coil geometry for an NMR magnet is a solenoidal arrangement, wherein the winding packet should include as many layers as possible. This requirement for HTS conductors is opposed by the above mentioned reaction conditions which require that sufficient oxygen reaches the conductors during production of the winding.

To realize this, winding techniques ("wind-and-react") are known from the field of metallic superconductors, such as e.g. $Nb_3Sn$, which permit winding of e.g. helium transparent coils. With this technology, the superconductor is wound onto longitudinal rods disposed parallel to the axis a and the lateral separation between the conductors is ensured through numerous spacers. However, this production method requires neither thermal treatment nor oxygen supply. The process control is therefore substantially less critical than the above described production of HTS conductors. Pure thermal treatment is carried out which can extend over long intervals of up to a week and the windings can be denser.

The technology used for producing metallic superconductors is also inappropriate for producing HTS conducting pieces since the spacers and distancers must withstand the thermal treatment temperatures and the oxygen atmosphere without thereby reacting with the superconductor. This drastically limits the possible materials. For these reasons, a thermally treated solenoidal transparent coil of HTS material has not been designed or produced to date.

In view of the above, it is the underlying purpose of the present invention to provide an NMR-capable solenoid coil with a minimum number of superconducting joints and a topologically simple construction, which can carry a current of a few hundred amperes and which contains HTS material to permit production of magnetic fields of more than 21 Tesla, fields which cannot be achieved using metallic superconducting material alone.

SUMMARY OF THE INVENTION

In accordance with the invention, this object is achieved in a surprisingly simple and effective fashion in that the radially innermost coil section comprises superconducting wire which contains oxidic high temperature superconducting (HTS) material, wherein the layers of the radially innermost coil section are helically wound such that there is a free axial separation between the windings which is subsequently filled-up.

This permits production of the radially innermost coil section of a superconducting highest field magnetic coil of the above-described type from HTS material despite the various difficulties described above and in a technically straightforward fashion to thereby permit the entire coil to produce still higher magnetic fields than presently possible, i.e. of a magnitude in excess of 21 T, and with sufficiently high current carrying capability. The radially innermost coil section can, in particular, be designed as a compact solenoid coil with simple topology wherein only a minimum amount of superconducting joints to the radially outer coils are required for considerably reducing the danger of joint failure and to reduce the technical effort required for the superconducting joints. In this fashion, extremely homogeneous magnetic fields can be produced, e.g. for NMR applications, with field strengths which cannot be achieved using conventional metallic superconductors only, such as e.g. $Nb_3Sn$.

The geometrically elegant helical winding with axial separations between the windings allows free access for the required oxygen and heat to the original HTS material from all sides during the production process without portions of the resulting superconductor sections being of differing quality. Due to the isotropy of the production conditions, the final product, the radially innermost coil section of a superconducting very high field magnet coil, has the largest possible isotropy of its properties.

For mechanical stabilization of the winding packet produced in this fashion, the hollow spaces, in particular the free axial and radial separations are filled with a moldable material. This is required since the extremely high magnetic fields would otherwise create motion of the conductors during current flow due to the Lorentz forces acting on the conductor sections which would produce considerable disturbances in the magnetic field to be produced.

The main applications of the inventive very high field magnet coils are in the field of NMR, in particular for magnet arrangements which are operated for a long time in superconducting persistent mode. Other applications are also feasible wherein magnetic fields of a particularly high field strength and high field homogeneity are to be produced e.g. for research.

One embodiment of the inventive magnet arrangement is particularly preferred wherein the pitches of the helical windings of radially subsequent layers alternate.

This maintains the full transparency of the oxygen and heat supply during the production process of the HTS coil section and in the radial direction as well.

To maintain the radial transparency during the production process while maintaining radial electrical insulation between the layers, a further embodiment of the invention provides that the layers of the radially innermost coil section are separated radially by a perforated, electrically insulating layer of high-temperature resistant material.

Care should thereby be taken that the material of the electrically insulating layer withstands the heat treatment conditions in the production process for the HTS sections which require thermal treatment at approximately 800° C. according to the current state of knowledge.

The use of an electrically insulating layer radially disposed between the individual layers can also be omitted should the wire of the coil section itself be insulated. In this case, the insulating material of the wire must be selected to ensure sufficient supply of oxygen to the HTS starting material.

In a simple further development of the above-described embodiment of the inventive magnet arrangement, the electrically insulating layer of high-temperature resistant material has a perforated sheet, mat, net or mesh structure.

Alternatively, in other further developments, the electrically insulating layer of high-temperature resistant material can comprise strips which extend in an axial direction and which are separated from each other in the peripheral direction about the central axis a. This ensures axial flow of oxygen through each layer of the coil section during the production process.

In a further alternative, the electrically insulating layer of high-temperature resistant material comprises strips which extend annularly about the central axis a and which are axially separated from each other to ensure azimuthal flow.

In general, the sizes and spatial positions of all perforations used, the axial separations, and the pitch of the helical windings should be coordinated to guarantee good flow through the coil section during the production phase.

In one embodiment of the inventive magnet arrangement having high oxygen transparency, the support body comprises a cylindrical inner pipe having axial end flanges, wherein the inner tube and/or the end flanges are perforated.

One further development of this embodiment is particularly favourable with which the support body has a jacket tube disposed radially about the central axis a. During production, the flow direction and strength of the treatment gas can be influenced by the jacket tube. Moreover, the radial jacket tube mechanically stabilizes the winding packet and can also be used as transport protection for the finished coil section after termination of the production process.

In one possible embodiment, the jacket tube can have a continuous massive wall to permit axial flow during the production process.

In an alternative embodiment, the wall of the jacket tube is perforated to provide axial flow.

In a preferred further development, the jacket tube can be removed from the support body to save space during operation of the inventive magnet arrangement.

If the wires of the innermost coil section which are used for the windings are not electrically insulated, electrical short-circuiting to the support body is prevented by providing the support body, at least on its winding side, with a high-temperature resistant insulation layer. This insulation layer can be realized through coating, in particular vaporization, or by mats, nets, foils and the like.

In another advantageous development, the cylindrical inner tube has a helical structure on its radially outer side whose pitch is opposite to that of the radially innermost winding layer. This simulates a further winding layer to completely retain the transparency for the oxygen supply during the production process.

In further developments, the radial jacket tube can have a helical structure on its radially inner side with a pitch opposite to that of the radially outermost winding layer.

In another advantageous embodiment of the inventive magnet arrangement, an additional radially innermost and/or radially outermost winding layer is provided through which no magnetic current flows during operation. The radially outermost and radially innermost layers of the coil sections are naturally more exposed to the supplied oxygen during the production process than the radially inner layers. These boundary layers are therefore particularly susceptible to anisotropy in production quality. In accordance with the above-described embodiment it is therefore advantageous to replace these particularly prone layers with "dummy" layers which do not contribute to the generation of a magnetic field during operation of the inventive magnet arrangement.

In a particularly advantageous further embodiment of the inventive magnet arrangement, the radially innermost coil section contains, at least in one layer, a further wire through which no magnetic flux flows during operation and which is helically wound at an axial separation from the superconducting wire. This produces mechanical stabilization of the superconducting wire during production and also during operation.

In a further development of this embodiment, the further wire has a different, preferably larger radial extension than the superconducting wire. This embodiment supports the electrical insulation between the respective layers of the coil section and mechanically fixes the respectively bordering layer.

The sealing material between the windings and in the hollow spaces of the inventive innermost coil section is usually non-conducting and provides electrical insulation between the individual conductor parts in addition to mechanical stabilization.

If the superconducting wires of the radially innermost coil section are electrically insulated, e.g. by a corresponding layer, the sealing material can also be electrically conducting. In case of a breakdown in superconductivity (=quench), this permits a more rapid discharge of the released electrical current and the associated heat to prevent or curtail mechanical damage to the magnet arrangement.

In most cases, the superconducting wire has a cylindrical, in particular circular cylindrical or oval cross-section.

For particular applications, the cross-section of the superconducting wire of the radially innermost coil section can be square, in particular flat and band-like.

A further advantageous embodiment of the inventive magnet arrangement is characterized in that the free axial separation between the windings of the radially innermost coil section varies from layer to layer or within one layer. This produces further freedom for homogenizing the magnetic field to be produced and for optimizing flow control of the treatment gas.

In particular, in the field of magnetic resonance, it is advantageous if the magnetic field produced by the magnet arrangement is extremely stable with time during operation. One embodiment of the inventive magnet arrangement is therefore advantageous with which a superconducting switch is provided for a superconducting persistent mode operation of the very high field magnet coil.

Also within the scope of the present invention is a method for producing a substantially solenoidal, multi-layer coil section wound in layers about a central axis a onto a hollow cylindrical support body which can carry a current of more than 100 A during operation for a superconducting very high field magnet coil, in particular, for a magnet arrangement of the above-described inventive type. In accordance with the invention, the production method is characterized by the following steps:

(a) helical winding of a layer of superconducting wire which contains oxidic high temperature superconducting (HTS) material together with a filler wire onto the support body;

(b) removing the filler wire from the support body, (c) repeating the steps (a) and (b) until the desired number of layers of the coil section is obtained;

(d) thermal treatment of the winding packet for reacting the HTS material under a gaseous atmosphere containing $O_2$ with annealing parameters optimized for the HTS material used;

(e) sealing the hollow spaces of the coil section.

The use of filler wire for winding the layers of the inventive coil section permits free adjustability of the axial separations and associated radial and azimuthal transparency for free access of the gaseous atmosphere and thermal flow to the inner layers of the coil section during the production process. Suitable selection of shape and material type of the filler wire further optimizes the production process.

One variant of the inventive method is particularly preferred wherein, in step (a), several parallel filler wires are wound together with the superconducting wire of HTS material and at least one of the filler wires is not removed in step (b). The filler wire remaining in the winding packet mechanically stabilizes the coil section. Preferably, special steel wire is used as the remaining filler wire.

To facilitate precise critical temperature control in the direct vicinity of the wires of HTS material which are to be treated during production, a preferred further embodiment of this method variant provides that the filler wire remaining in the winding in step (d) is electrically heated.

In a further advantageous variant of the inventive method, filler wire is co-wound on both sides of the superconducting wire of HTS material in step (a). This ensures that the superconducting wire has sufficient separation at the axial ends from the support body of the coil section to produce complete transparency of the winding also at the coil ends and to prevent an electrical short-circuit.

To considerably facilitate the winding process during production of the inventive coil section, variants of the inventive method can provide that the filler wire wound in step (a) is not removed in step (b) and that, before or during step (d), at least part of the filler wire is reduced or removed in all layers. The reduction of the filler wire which is no longer required after the production process, can be effected in a thermal, chemical or biological manner. It must be ensured that as few remnants as possible remain in the winding packet. A different possibility is mechanical removal, e.g. by pulling out the wire.

In a further variant of the inventive method, the production process can be designed such that the inner bore of the hollow cylindrical support body is sealed in a gas-tight fashion at an axial end and is provided with a gas suctioning device at the axially opposite end through which gas of the gas atmosphere is suctioned in step (d), with a jacket tube being disposed radially about the coil section in a gas-tight fashion and having perforations through which (in step (d)) gas can enter into the inner bore of the support body to effect a uniform flow of gas through the coil section in step (d).

This produces a radial flow through the winding packet during production. The gas flow direction can also be reversed.

In an alternative method variant, the inner bore of the hollow cylindrical support body is not perforated, in particular gas-tight, and a jacket tube is disposed in a gas-tight manner radially about the coil section, wherein the jacket tube is not perforated and is gas tight, with axial end flanges being disposed at both axial ends of the support body through which the gas atmosphere is pumped in step (d). This produces an axial flow through the winding packet during the production process.

A manner of carrying out the production process is particularly advantageous with which the temperature of the gas pumped in step (d) is kept stable and is preferably controlled. This permits accurate setting and precise adjustment of the critical process parameters such that the inventive coil section, as a basic product, has properties which can be defined within extremely close tolerances in response to the respective selected process.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for illustrating the invention.

The invention is shown in the drawing and is explained in more detail by means of embodiments.

DESCRIPTION OF THE PREFERRED EMBODIMENT

Figure 1:
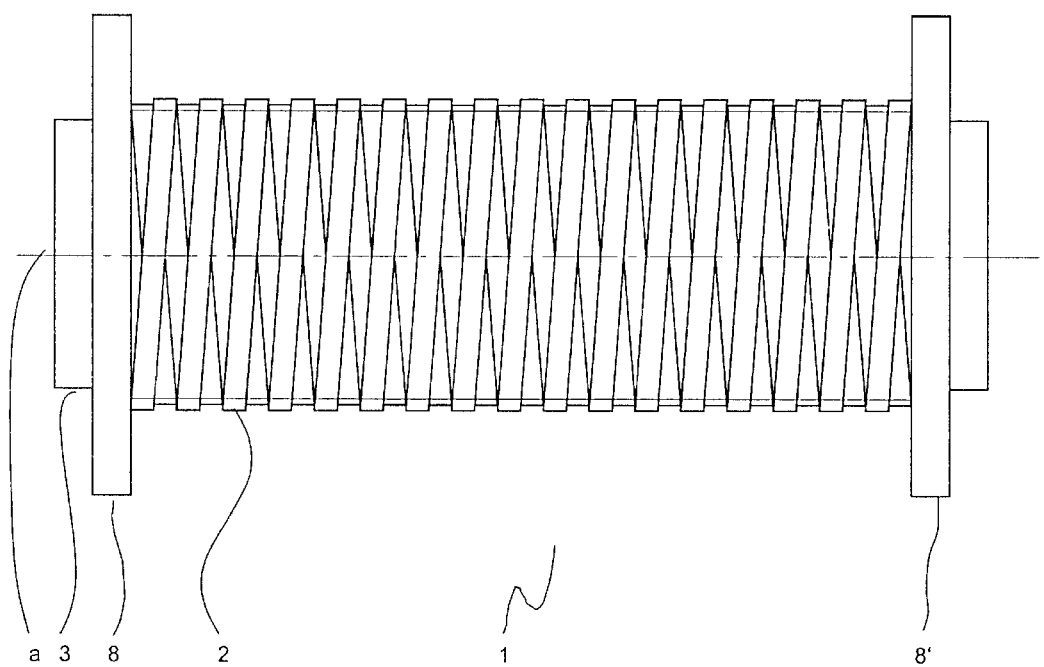
FIG. 1 shows a schematic representation of a coil section helically wound onto a hollow cylindrical support body, wherein, in accordance with the invention, there is a free axial separation between the windings, which is subsequently filled-up.

FIG. 1 schematically shows the coil section 1 as viewed from the side onto the longitudinal axis. A superconducting wire 2 (in two layers in the example shown) is helically wound about a hollow cylindrical support body 3 with axial end flanges 8, 8' such that a free axial separation remains between the windings in the direction of a central axis a which is subsequently filled following production of the coil section 1.

In the embodiment shown, the superconducting wire 2 of HTS material has the dimensions 3×12 mm. FIG. 1 shows the winding path for the first two layers of the coil package. They are openly wound, i.e. the superconductor itself occupies only half of the winding volume and the other half remains free. This type of winding ensures that the winding packet is transparent even through a plurality of layers such that oxygen can flow through it during the annealing production process. The oxygen can penetrate from the side of the conductor into the conductor, unhindered throughout the entire winding packet and across approximately half the winding, from the upper and lower side of the conductor. Since diffusion of oxygen is much higher on the sides of the conductor than at the upper and lower surfaces, all locations of the superconductor react according to the desired set parameters. To produce such a transparent winding with uniform and accurate separations—which must be maintained due to the required homogeneity—one proceeds as follows:

A so-called filler wire having the same dimensions as the superconductor is simultaneously wound therewith. When one end of the winding layer has been reached, the filler wire is cut and reversely wound out of the winding. This produces the gap for generating the transparent winding (FIG. 1) which is required for the process.

A filler wire having the same height but different width than the superconducting wire can be wound instead of the filler wire having the same geometry to permit full adjustment of the width of the corresponding gap. Appropriate selection of the filler wire permits selection of the transparency of the winding as required for the process.

A further possibility consists in simultaneously winding several different filler wires instead of one single filler wire. Instead of a Cu wire alone, a Cu wire, a wire of a different material, and a further CU wire can also be alternately wound into the gap. In this case, the two Cu wires are wound out of the winding after completion of a layer, the wire of other material, however, remains in the center of the layer.

This produces the following effects: During thermal treatment of the transparent winding, thermal changes could lead to reduction in the winding tension and cause deformation or even slippage of the winding which would clearly preclude achievement of the homogeneity requirements. Since the thermal expansion coefficient of the other added wire material is smaller than that of the ceramic superconductor, the winding tension is maintained during thermal treatment.

Figure 2:
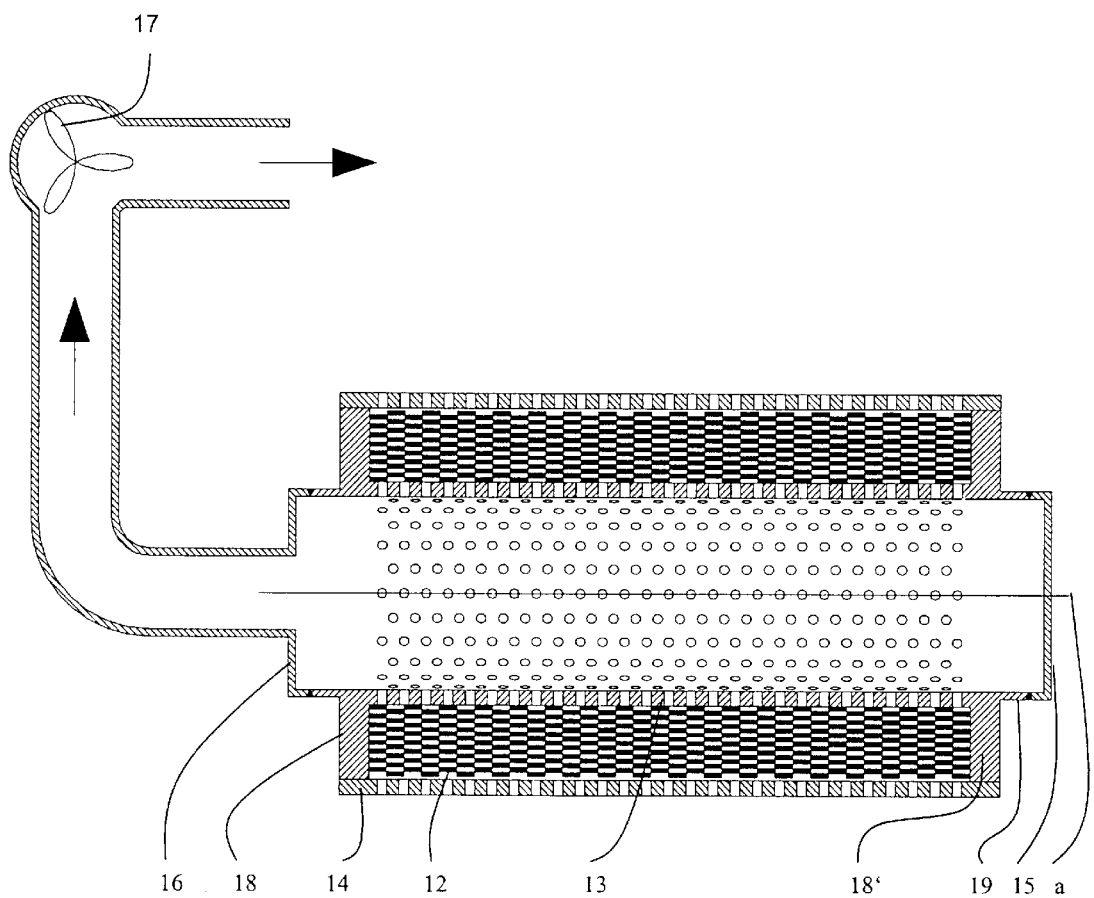
FIG. 2 shows a schematic longitudinal section through a winding packet with an inventive coil section, a perforated jacket tube about the winding packet, a hollow cylindrical support body perforated in the inner bore and a pump means for pumping the gas atmosphere for annealing the winding packet.

This construction has the further advantage that the other added material also assists in operation of the magnet coil and helps the winding to withstand stronger forces. For further stabilization of the winding during the reaction, a gas-permeable, collar-like jacket tube 14 can be outwardly disposed over the support body 13 to further stabilize the HTS wire 12 windings (shown in cross-section through the winding packet of FIG. 2).

After the thermal treatment, the open spaces in the transparent winding are filled with a suitable material. This can be effected e.g. by vacuum sealing with wax or with an epoxy resin.

The thermal treatment with which the oxygen must also reach the superconductor inside the winding, is carried out as follows: The winding is disposed on a support body 13 having numerous holes and formed from a cylindrical inner pipe 19 with gas-tight end flanges 18, 18'. The cylindrical bore of the support body 13 is sealed at one end with a lid 15 and the other end is provided with a tube connection 16 leading to a blower 17 which circulates the gas atmosphere. This produces a uniform radial gas flow, transversely through the winding and through the support body 13. The flow direction can thereby be adjusted in both directions. The gas must not be circulated in an oven but can also be removed from the oven and be input at another location. Fresh gas can also be added.

Figure 3:
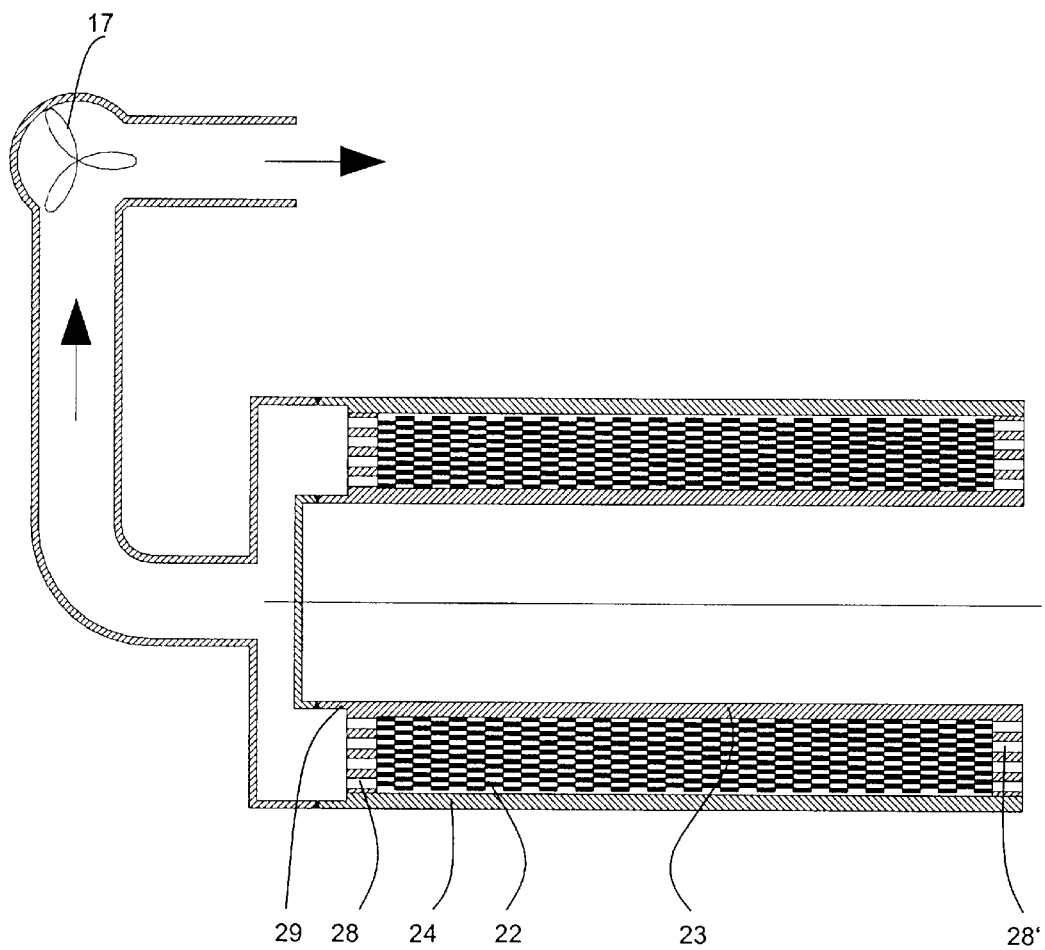
FIG. 3 corresponds to FIG. 2, however, with gas-tight jacket tube and gas-tight inner tube of the support body for axial gas flow through the end flanges of the support body.

FIG. 3 shows a device for carrying out a process with which gas flows through the winding in an axial rather than a radial direction. The inner bore of the hollow cylindrical support body 23 is not perforated but gas-tight, and the jacket tube 24, disposed radially about the coil section with the HTS wire windings 22, is also fashioned in a gas-tight manner, without perforations. Both axial ends of the support body 23 have end flanges 28, 28' through which the gas of the gas atmosphere can be pumped in the axial direction of the arrangement.

We claim:

1. A superconducting very high field magnet arrangement having a plurality of substantially solenoidal multi-layer coil sections wound into layers about a common central axis a and which are electrically connected in series to carry an operating current in excess of 100 A, the magnet arrangement comprising:

a hollow cylindrical support body;

a radially innermost superconducting coil section containing oxidic, high temperature superconductor (HTS) wire material, said innermost coil section helically wound concentrically with said support body to leave free axial separations between windings thereof; and means for filling said free axial separations.

2. The magnet arrangement of claim 1, wherein pitches of said helical windings of sequentially radial layers alternate.

3. The magnet arrangement of claim 1, further comprising a perforated, electrically insulating layer of high temperature resistant material disposed to radially separate layers of said radially innermost coil section.

4. The magnet arrangement of claim 3, wherein said electrically insulating layer of high temperature resistant material has a perforated sheet, mat, net or mesh structure.

5. The magnet arrangement of claim 3, wherein said electrically insulating layer of high-temperature resistant material has strips which extend in an axial direction and which are separated from each other in a peripheral direction about the central axis a.

6. The magnet arrangement of claim 3, wherein said electrically insulating layer of high-temperature resistant material has strips which extend annularly about the central axis a and which are axially separated from each other.

7. The magnet arrangement of claim 1, wherein said support body comprises a cylindrical inner tube having axial end flanges, wherein at least said one of said inner tube and said end flanges have perforations.

8. The magnet arrangement of claim 7, wherein said support body comprises a jacket tube disposed radially about the central axis a to surround said inner tube and said superconducting coil section.

9. The magnet arrangement of claim 8, wherein said jacket tube has a continuous, massive wall.

10. The magnet arrangement of claim 8, wherein said jacket tube has a perforated wall.

11. The magnet arrangement of claim 8, wherein said jacket tube can be removed from said support body.

12. The magnet arrangement of claim 7, wherein said support body has a high temperature resistant insulation layer on at least a side facing said windings.

13. The magnet arrangement of claim 7, wherein said cylindrical inner tube has a helical structure on a radial outer side thereof whose pitch is opposite to a pitch of a radially innermost winding layer.

14. The magnet arrangement of claim 8, wherein said jacket tube has a helical structure on a radial inner side thereof having a pitch opposite to a pitch of a radially outermost winding layer.

15. The magnet arrangement of claim 1, wherein at least one layer of said radially innermost coil section comprises a further wire that carries no magnetic current during operation and which is helically wound at an axial separation from said superconducting wire material.

16. The magnet arrangement of claim 15, wherein said further wire has a different radial extension than said superconducting wire material.

17. The magnet arrangement of claim 15, wherein said further wire has a larger radial extension than said superconducting wire material.

18. The magnet arrangement of claim 1, further comprising at least one of an additional radially innermost and an additional radially outermost winding layer through which no magnet current flows during operation thereof.

19. The magnet arrangement of claim 1, wherein said filling means of said radially innermost coil section is electrically non-conducting.

20. The magnet arrangement of claim 1, wherein said filling means of said radially innermost coil section is electrically conducting.

21. The magnet arrangement of claim 1, wherein said superconducting wire has one of a cylindrical, a circular, and an oval cross-sectional shape.

22. The magnet arrangement of claim 1, wherein said superconducting wire has one of a square, and a flat, band-like cross-sectional shape.

23. The magnet arrangement of claim 1, wherein said free axial separations between said windings of said radially innermost coil section vary from layer to layer.

24. The magnet arrangement of claim 1, wherein said free axial separations between said windings of said radially innermost coil section vary within one layer.

25. The magnet arrangement of claim 1, further comprising a superconducting switch disposed for superconducting persistent mode operation of the very high field magnet coil.

26. A method for producing a substantially solenoid-shaped multi-layer coil section which is wound about a common central axis a and which can carry a current of more than 100 A during operation for a superconducting very high field magnet coil, the method comprising the steps of:

(a) helically winding a layer of superconducting wire which contains oxidic, high temperature superconductor (HTS) material, together with a filler wire, onto a support body;

(b) removing at least some of said filler wire from said support body;

(c) repeating steps (a) and (b) until a desired number of layers of coil section is obtained;

(d) thermally treating said coil section for reacting the HTS material, under a gaseous atmosphere containing $O_2$, with annealing parameters optimized for said HTS material; and (e) sealing hollow spaces of said coil section.

27. The method of claim 26, wherein, in step (a), several parallel filler wires are wound together with said superconducting wire of HTS material and, in step (b), at least one of said filler wires is not removed.

28. The method of claim 27, wherein, in step (d), said filler wire which remained in said coil section is electrically heated.

29. The method of claim 26, wherein, in step (a), said filler wire is wound on both sides of said superconducting wire of HTS material.

30. The method of claim 26, wherein said filler wire added in step (a) is not removed in step (b), rather, before or during step (d), at least part of said filler wire is reduced or removed from all layers.

31. The method of claim 26, wherein an inner bore of said hollow cylindrical support body is sealed in a gas-tight fashion at one axial end and further comprising a gas suctioning device cooperating with an axially opposite end through which gas of a gas atmosphere is suctioned in step (d), and further comprising a jacket tube disposed in a gas-tight fashion radially about said coil section, said jacket tube having perforations through which gas can enter into said inner bore of said support body during step (d) to uniformly flow said gas atmosphere through said coil section.

32. The method of claim 31, further comprising reversing a gas flow direction.

33. The method of claim 26, wherein an inner bore of said hollow cylindrical support body is not perforated and further comprising a jacket tube having substantially no perforations and radially disposed about said coil section as well as axial end flanges disposed at both axial ends of said support body through which gas atmosphere is pumped in step (d).

34. The method of claim 31, wherein a temperature of said gas is kept stable during step (d).

* * * * *